United States Patent
Kwon

(10) Patent No.: US 7,932,593 B2
(45) Date of Patent: *Apr. 26, 2011

(54) MULTIPACKAGE MODULE HAVING STACKED PACKAGES WITH ASYMMETRICALLY ARRANGED DIE AND MOLDING

(75) Inventor: Hyeog Chan Kwon, Seoul (KR)

(73) Assignee: STATS Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/433,852

(22) Filed: Apr. 30, 2009

(65) Prior Publication Data

US 2009/0218675 A1    Sep. 3, 2009

Related U.S. Application Data

(63) Continuation of application No. 11/394,363, filed on Mar. 30, 2006, now Pat. No. 7,545,031.

(60) Provisional application No. 60/670,443, filed on Apr. 11, 2005.

(51) Int. Cl.
*H01L 23/498* (2006.01)
*H01L 23/02* (2006.01)
*H01L 23/48* (2006.01)

(52) U.S. Cl. ........... 257/690; 257/E23.069; 257/E23.02; 257/E23.052; 257/E25.013; 257/734; 257/762; 257/766; 257/758; 257/773; 257/686; 257/E23.085; 257/E25.023; 257/E21.503; 257/782; 257/786

(58) Field of Classification Search .................. 257/690, 257/E21.499, E23.069, 686, 685, 777, 723, 257/778, 734, 737, 738, E23.085, E25.023, 257/E21.503, 782, 786

See application file for complete search history.

(56) References Cited

U.S. PATENT DOCUMENTS

| | | |
|---|---|---|
| 5,854,507 A | 12/1998 | Miremadi et al. |
| 6,287,892 B1 | 9/2001 | Takahashi et al. |
| 6,339,254 B1 | 1/2002 | Venkateshwaran et al. |
| 6,369,448 B1 | 4/2002 | McCormick |
| 6,493,229 B2 | 12/2002 | Akram et al. |
| 6,544,815 B2 | 4/2003 | Isaak |
| 6,740,981 B2 | 5/2004 | Hosomi |
| 6,756,684 B2 | 6/2004 | Huang |
| 6,791,192 B2 | 9/2004 | Lin et al. |
| 7,002,805 B2 | 2/2006 | Lee et al. |

(Continued)

*Primary Examiner* — Alexander O Williams

(57) ABSTRACT

Semiconductor chip packages have die asymmetrically arranged on the respective substrates. Two such packages having complementary arrangements can be stacked, one inverted with respect to the other, such that the two die are situated side-by-side in the space between the two substrates. Also, multipackage modules include stacked packages, each having the die asymmetrically arranged on the substrate. Adjacent stacked packages have complementary asymmetrical arrangements of the die, and one package is inverted with respect to the other in the stack, such that the two die are situated side-by-side in the space between the two substrates. Also, methods are disclosed for making the packages and for making the stacked package modules.

22 Claims, 4 Drawing Sheets

U.S. PATENT DOCUMENTS

| | | |
|---|---|---|
| 7,015,572 B2 | 3/2006 | Yamaji |
| 7,081,678 B2 | 7/2006 | Liu |
| 7,180,166 B2 | 2/2007 | Ho et al. |
| 7,276,784 B2 | 10/2007 | Omizo et al. |
| 7,397,132 B2 | 7/2008 | Suzuya |
| 7,400,032 B2 | 7/2008 | Corisis et al. |
| 7,427,535 B2 | 9/2008 | Vaiyapuri |
| 7,459,773 B2 * | 12/2008 | Bolken et al. .................. 257/686 |
| 7,479,407 B2 | 1/2009 | Gehman et al. |
| 7,514,776 B2 | 4/2009 | Vaiyapuri |
| 7,545,031 B2 * | 6/2009 | Kwon ........................... 257/686 |
| 2004/0164412 A1 * | 8/2004 | Bolken et al. ................. 257/737 |
| 2005/0184377 A1 | 8/2005 | Takeuchi et al. |
| 2005/0205975 A1 * | 9/2005 | Kang et al. .................... 257/678 |
| 2007/0108583 A1 | 5/2007 | Shim et al. |
| 2007/0120243 A1 | 5/2007 | Yanagisawa et al. |
| 2007/0210433 A1 | 9/2007 | Subraya et al. |

* cited by examiner

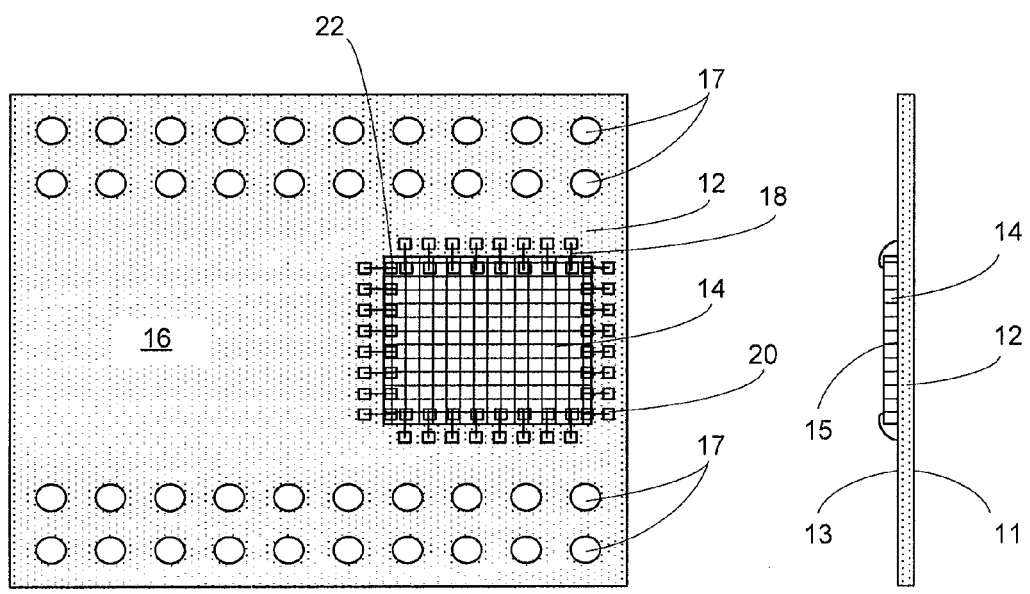
Fig. 1A
Fig. 1C
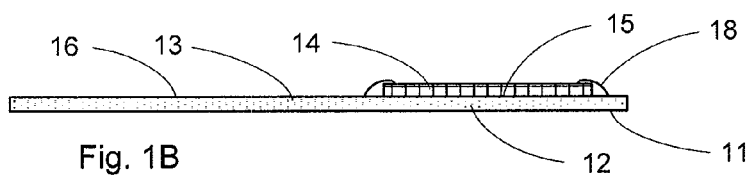
Fig. 1B

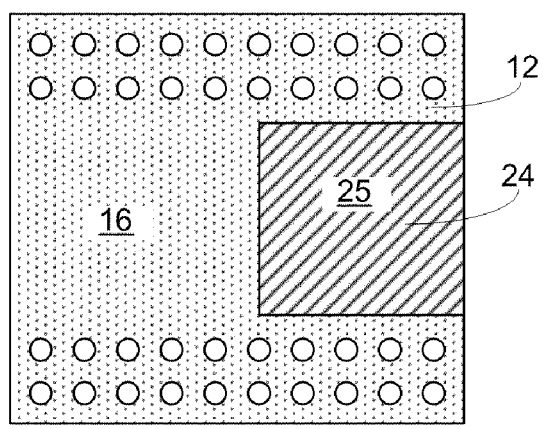
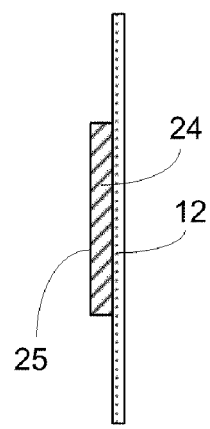
Fig. 2A     Fig. 2C
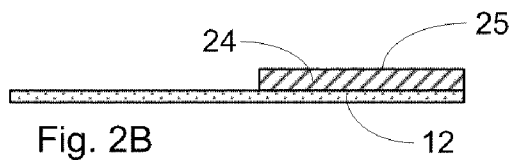
Fig. 2B
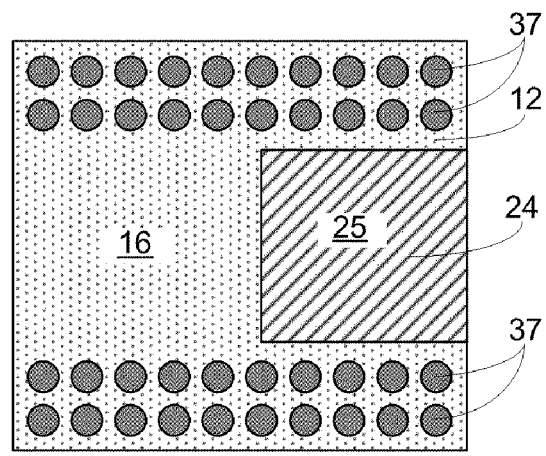
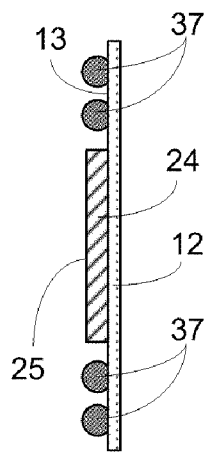
Fig. 3A     Fig. 3C
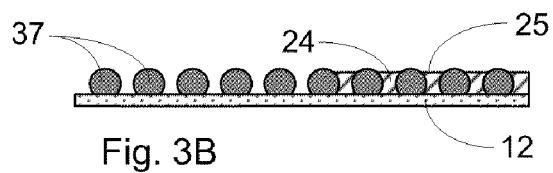
Fig. 3B

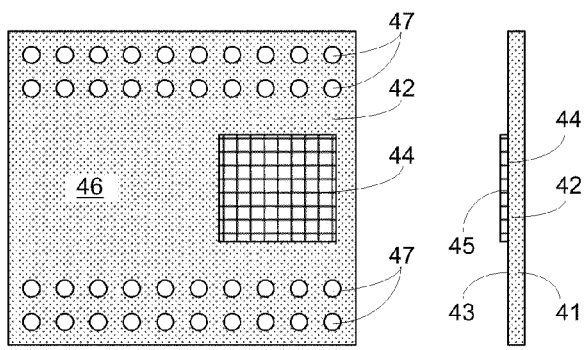
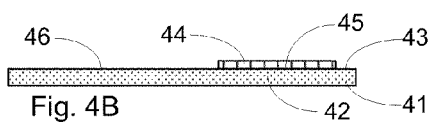
Fig. 4A   Fig. 4C
Fig. 4B
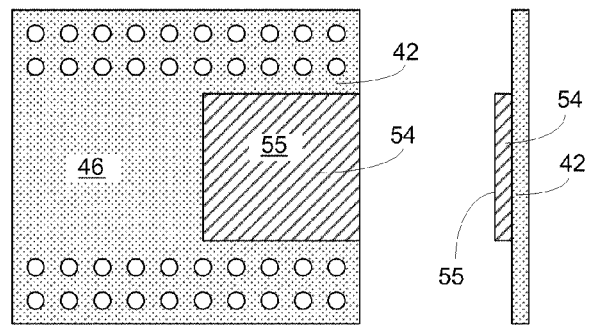
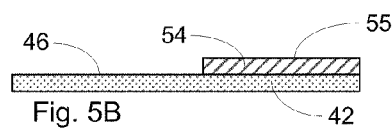
Fig. 5A   Fig. 5C
Fig. 5B
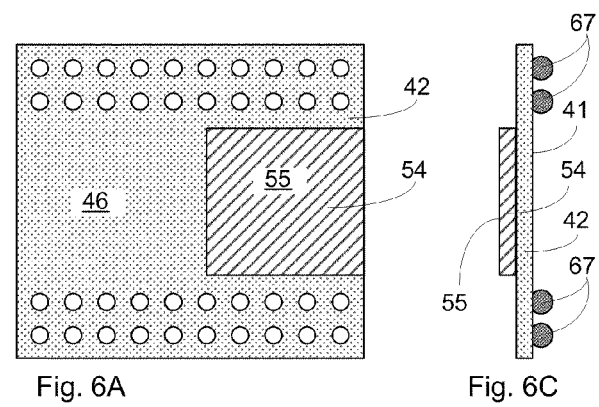
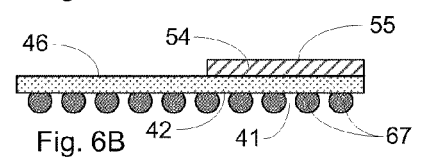
Fig. 6A   Fig. 6C
Fig. 6B

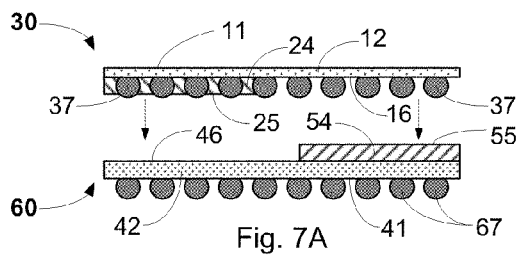
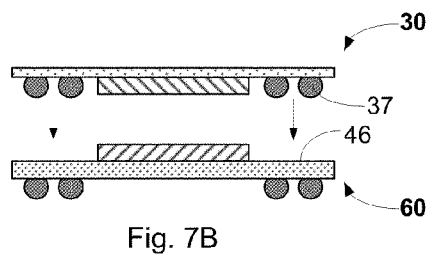
Fig. 7A
Fig. 7B
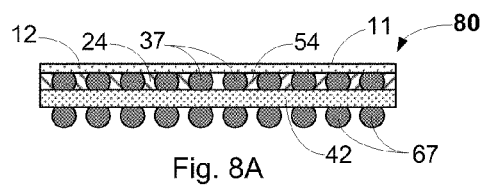
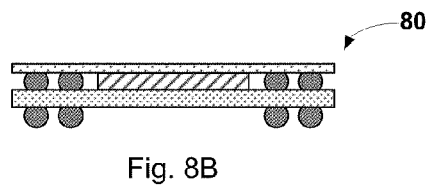
Fig. 8A
Fig. 8B
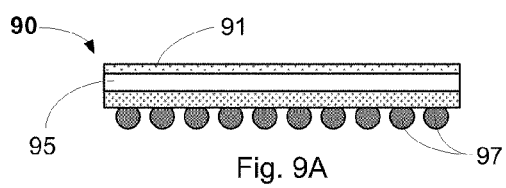
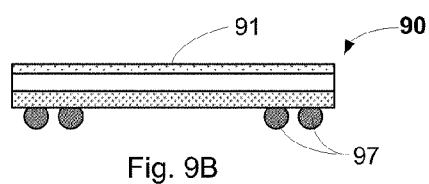
Fig. 9A
Fig. 9B
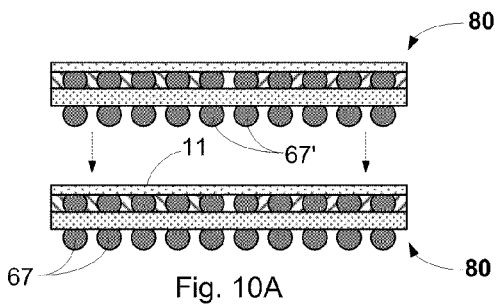
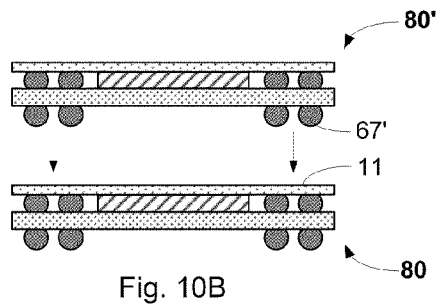
Fig. 10A
Fig. 10B
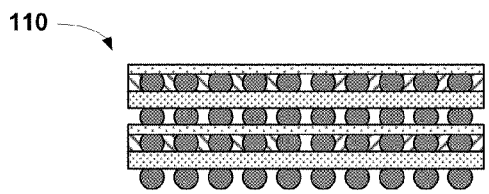
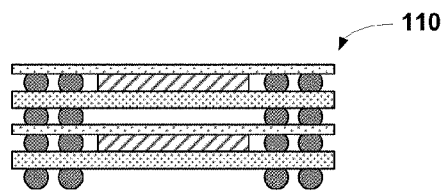
Fig. 11A
Fig. 11B
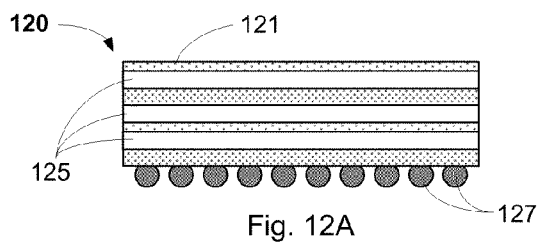
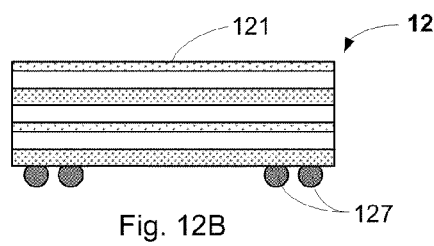
Fig. 12A
Fig. 12B

MULTIPACKAGE MODULE HAVING STACKED PACKAGES WITH ASYMMETRICALLY ARRANGED DIE AND MOLDING

CROSS-REFERENCE TO RELATED APPLICATION

This is a continuation of U.S. Non Provisional patent application Ser. No. 11/394,363, now U.S. Pat. No. 7,545,031, filed Mar. 30, 2006, which claims the benefit of U.S. Provisional Application No. 60/670,443, filed Apr. 11, 2005, which is hereby incorporated by reference in its entirety.

BACKGROUND

This invention relates to semiconductor chip packaging and, particularly, to stacked package modules.

One approach to increasing the density of semiconductor functionality in semiconductor chip packages is to stack die, one over another, on a package substrate. Electrical interconnection of the stacked die may be die-to-die and/or die-to-substrate, for example by wire bonding. It is technically difficult and therefore costly to test die prior to assembly in the stacked die package, and some number of "bad" die are expected in the supply. One bad die in a stacked die package can render the entire package bad and, accordingly, significant waste of materials and manufacturing time can inevitably result in the manufacture of stacked die packages, particularly where a larger number of die are stacked in the package. Stacked die packages having as many as four, five or six die are in use. Stacked die packages can be made very thin, even where spacers between adjacent die are required.

Another approach to increasing the density of semiconductor functionality in semiconductor chip packages is to stack packages, one over the other, to form a stacked package module. Each package in the module includes at least one die, affixed to and electrically interconnected with, a substrate. The packages in the stack are electrically interconnected, for example by wire bonds between bond sites on the respective package substrates. This has the advantage that the packages can be fully tested before they are assembled in the stack; "bad" packages are discarded, and only packages testing as "good" are used in the module.

Several elements contribute to the thickness of a typical stacked package module. At a minimum, the thicknesses of the respective substrates and die, and die attach adhesive, contribute. Additionally, where the die in each package are molded (or encapsulated) the mold cap has a thickness typically greater than that of the die, and where the die is wire bonded to the substrate the mold cap must be thick enough to completely cover the wires, plus a tolerance for variation in wire loop height. And typically the package stack is also molded or encapsulated with a module molding, which may add additional thickness.

In products where a limit is imposed on both package footprint and package thickness, such as for example in mobile devices such as cellular telephones, PDAs, digital cameras, and various consumer electronic devices, it is desirable to make packages (or modules) as thin as possible without increasing the footprint beyond the limits.

SUMMARY

In one general aspect the invention features semiconductor chip packages having asymmetrically arranged die. Two such packages having complementary arrangements can be stacked, one inverted with respect to the other, such that the two die are situated side-by-side in the space between the two substrates. In some embodiments the die is affixed to its respective substrate using an adhesive, and is electrically interconnected to the substrate by wire bonding; and in some embodiments the die is mounted onto the respective substrate by flip-chip interconnection. The die may be molded.

In another general aspect the invention features multipackage modules including stacked packages, each having asymmetrically arranged die. The packages have complementary asymmetrical arrangements, and one package is inverted with respect to the other in the stack, such that the two die are situated side-by-side in the space between the two substrates. The z-interconnection between adjacent packages is by solder balls, and the solder ball height is sufficient to provide space for the die. Because the die are situated side-by side, the module thickness is reduced.

In another general aspect the invention features methods for making the packages and for making the stacked package modules.

The stackable complementary packages according to the invention can be made using currently available manufacturing equipment and materials and conventional surface mount technologies. The assembly process can be less complex than for modules having packages stacked one over the other, and the resulting thickness profile can be less. Stack thickness in module assemblies is reduced according to the invention, by virtue of the fact that the two die on the two joined complementary packages share the space between the substrates and an additional die and die attach and mold cap thickness is avoided. Manufacturing costs can be reduced according to the invention by performing only a single solder ball reflow for the entire assembly, following alignment of the stacked complementary packages. The individual packages are fully testable.

BRIEF DESCRIPTION OF THE DRAWINGS

FIG. 1A is a diagrammatic sketch in a plan view showing a die mounted asymmetrically on a substrate according to a first embodiment of the invention.

FIGS. 1B and 1C are diagrammatic sketches in side and front elevational views showing the die mounted asymmetrically on the substrate as in FIG. 1A.

FIG. 2A is a diagrammatic sketch in a plan view as in FIG. 1A, in which the asymmetrically placed die has been molded according to an embodiment of the invention.

FIGS. 2B and 2C are diagrammatic sketches in side and front elevational views showing the molded asymmetrically mounted die on the substrate as in FIG. 2A.

FIG. 3A is a diagrammatic sketch in a plan view as in FIG. 2A, in which z-interconnection solder balls have been mounted onto solder interconnect pads on the substrate to complete a stackable package according to a first embodiment of the invention.

FIGS. 3B and 3C are diagrammatic sketches in side and front elevational views showing the completed stackable package as in FIG. 3A.

FIG. 4A is a diagrammatic sketch in a plan view showing a die mounted asymmetrically on a substrate according to a second embodiment of the invention.

FIGS. 4B and 4C are diagrammatic sketches in side and front elevational views showing the die mounted asymmetrically on the substrate as in FIG. 4A.

FIG. 5A is a diagrammatic sketch in a plan view as in FIG. 4A, in which the asymmetrically placed die has been molded according to the second embodiment of the invention.

FIGS. 5B and 5C are diagrammatic sketches in side and front elevational views showing the molded asymmetrically mounted die on the substrate as in FIG. 2A.

FIG. 6A is a diagrammatic sketch in a plan view as in FIG. 5A, in which z-interconnection solder balls have been mounted onto solder interconnect pads on the substrate to complete the stackable package according to the second embodiment of the invention.

FIGS. 6B and 6C are diagrammatic sketches in side and front elevational views showing the completed stackable package as in FIG. 6A.

FIGS. 7A-9B are diagrammatic sketches in side and front elevational views showing steps in the construction of a stacked multipackage module, having two stacked packages, according to an embodiment of the invention.

FIGS. 8A-12B are diagrammatic sketches in side and front elevational views showing steps in the construction of a stacked multipackage module, having four stacked packages, according to an embodiment of the invention.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS. Also for clarity of presentation certain features are not shown if the FIGs., where not necessary for an understanding of the invention. For example, the patterned metal layers at the substrate surface are not shown, and the interconnections (wires or bumps) of the die to the substrate are not shown.

According to one aspect of the invention, packages have the die asymmetrically arranged on the substrate. That is, the die is attached (either affixed and wire bonded or mounted in a flip-chip fashion) on a die attach region toward an edge of the substrate, leaving an unoccupied region near the opposite edge of the substrate. In a first configuration, interconnect solder balls are mounted on the die mount side of the substrate; and in a complementary second configuration, solder balls are mounted on the side of the substrate opposite the die mount side. Complementary pairs of packages are stacked, one inverted with respect to the other, and the respective package substrates are electrically interconnected by the solder balls on the package that has solder balls on the die mount side of its substrate. The solder ball height is great enough to provide a standoff between the substrates to accommodate the thickness of the die (and die attach), and the packages are oriented so that the die on the first package is situated in the space between the package substrates over the unoccupied region of the second package substrate.

Turning now to FIGS. 1A, 1B and 1C there is shown a die 14 mounted asymmetrically on a die attach region 15 on a die mount surface 13 of a substrate 12 according to the invention. The die attach region 15 is situated toward an edge of the substrate, leaving an unoccupied region 16 of the die mount surface 13 situated toward the opposite edge of the substrate. The package substrate 12 is preferably a laminate substrate having at least two patterned metal layers with dielectric layers between, that is, it includes at least a first "upper" patterned metal layer at the die mount surface 13, and a second "lower" patterned metal layer at the surface (the "land" side) 11 opposite the die mount side. The various metal layers are patterned to provide suitable trace circuitry, and vias through the dielectric layers serve for connection between the layers. A passivation layer over the upper and lower patterned metal layers is patterned with openings exposing sites on the traces for electrical connection of the die, and exposing ball pads (shown at 17 in rows or arrays, at the die mount surface) for mounting solder balls. The die may be affixed to the die attach region using a die attach adhesive (such as a die attach epoxy or film) with the active side of the die facing away from the substrate, and electrically interconnected by wire bonds 18 between die pads 22 and bond pads 20 on the substrate 12. Or, the die may be mounted onto the substrate by flip chip attachment (not shown) with the active side of the die facing toward the substrate and electrically interconnected with bond sites on the substrate using conductive bumps or balls.

The die can then be molded, as shown in FIGS. 2A, 2B, and 2C. Where the die is interconnected by wire bonding, molding may be necessary, to prevent damage to the wires during subsequent steps. The molding 24 covers the die and wire bonds (where wire bond interconnection is used), and is formed to have a substantially planar "upper" surface 25. Where the die is mounted by flip-chip interconnection, a molding may not be required, although an underfill may be desirable, to fill the bump standoff space between the die and the substrate and to mechanically stabilize the interconnection.

Then, as shown in FIGS. 3A, 3B, and 3C, z-interconnection solder balls 37 are mounted on the ball pads on the die mount surface 13 of the substrate 12. Arrangements of ball pads and solder balls other than illustrated in the Figs. can be employed; in any event they are arranged so as not to occlude the unoccupied region 16 of the die mount surface 13 of the substrate. And they are arranged so that they provide a stable support for the complementary package to be inverted and mounted over the first package. The solder balls are dimensioned such that, when the complementary packages are joined and the solder balls reflowed, the ball height provides clearance between the adjacent substrates to accommodate the die (and, where present, the molding). Mounting the solder balls completes the first package 30, in which the solder balls are mounted on the die mount side of the substrate. As may be appreciated, as the solder balls collapse during the reflow to join the two complementary packages, the upper surface 25 of the molding 24 may contact the unoccupied region of the complementary package substrate, limiting further collapse of the solder balls.

A complementary package 60 according to an embodiment of the invention, in which the solder balls are mounted on the land side of the substrate, can be made as shown in FIGS. 4A-6C.

Turning now to FIGS. 4A, 4B and 4C there is shown a die 44 mounted asymmetrically on a die attach region 45 on a die mount surface 43 of a substrate 42 according to the invention. The die attach region 45 is situated toward an edge of the substrate, leaving an unoccupied region 46 of the die mount surface 43 situated toward the opposite edge of the substrate. The package substrate 42 is preferably a laminate substrate having at least two patterned metal layers with dielectric layers between, that is, it includes at least a first "upper" patterned metal layer at the die mount surface 43, and a second "lower" patterned metal layer at the surface (the "land" side) 41 opposite the die mount side. The various metal layers are patterned to provide suitable trace circuitry, and vias through the dielectric layers serve for connection between the layers. A passivation layer over the upper and lower patterned metal layers is patterned with openings exposing sites on the traces for electrical connection of the die, and exposing ball pads (shown at 47 in rows or arrays, at the die mount surface) for mounting solder balls. The die may be affixed to the die attach region using a die attach adhesive (such as a die attach epoxy or film), and electrically interconnected by wire bonds between die pads (not shown in the FIGs.) and bond pads on the substrate (not shown). Or, the die may be mounted onto and electrically interconnected with the substrate by flip chip attachment.

The die can then be molded, as shown in FIGS. 5A, 5B, and 5C. Where the die is interconnected by wire bonding, molding may be necessary, to prevent damage to the wires during subsequent steps. The molding 54 covers the die and wire bonds (where wire bond interconnection is used), and is formed to have a substantially planar "upper" surface 55. Where the die is mounted by flip-chip interconnection, a molding may not be required, although an underfill may be desirable, to fill the bump standoff space between the die and the substrate and to mechanically stabilize the interconnection.

Then, as shown in FIGS. 6A, 6B, and 6C, z-interconnection solder balls 67 are mounted on the ball pads on the land surface 41 of the substrate 42. Arrangements of ball pads and solder balls other than illustrated in the Figs. can be employed; in any event they are arranged so that they provide a stable support for mounting the assembly onto a mother board, or onto an additional assembly, or onto another support, as described below. Mounting the solder balls completes the second package 60, in which the solder balls are mounted on the land side of the substrate.

Assembly of complementary packages into multipackage modules according to the invention is shown by way of example in FIGS. 7A-9B and in FIGS. 10A-12B.

Formation of a unit of joined complementary packages 30 and 60 is shown by way of example in elevational views in FIGS. 7A-8B. In FIGS. 7A (side elevation) and 7B (front elevation) a first package 30 is shown inverted with respect to a second package 60, and aligned so that the solder balls 37 on the die mount side of the first package substrate 12 are aligned with the ball pads (not shown in this view) on the die mount side of the second package substrate 42, and so that the surface 25 of the mold cap on the first package 30 is aligned with the unoccupied region 46 of the die mount side of the second substrate 42 and the surface 55 of the mold cap on the second package 60 is aligned with the unoccupied region 16 of the die mount side of the first package 30. The manipulation of the packages can be done using conventional package assembly equipment. For example, the second package 60 can be placed on a support, and the first package can be manipulated into the appropriate position using a pick-and-place tool. Once aligned, the complementary packages are brought together, as suggested by the broken arrows in the FIGs., until the solder balls on the first package 30 contact the pads on the second package substrate 46. At this point the complementary package pair unit is complete. The unit can be heated to remelt the solder balls 37 and make the electrical interconnection of the package pair. The balls are shown collapsed following remelt in the unit assembly 80 in FIGS. 8A and 8B. Then the assembly can be encapsulated, as shown at 95 in FIGS. 9A and 9B to fill in the space between the substrates 12 and 42 around the die 25 and 55 and the solder balls 37. This completes a module 90 having two complementary packages. The module has an "upper" surface 91, and the solder balls on the second package, numbered 97 in FIGS. 9A and 9B, serve for electrical interconnection of the module 90 with a device in which it is employed, such as a motherboard, for example, in a mobile computing or communications product.

Complementary package pair units, such as unit 80 in FIGS. 8A and 8B, can be stacked to form modules having four or more packages. FIGS. 10A-12B illustrate for example the construction of a module 120 by stacking two complementary package pair units 80, 80' one over the other. In FIGS. 10A and 10B, complementary package pair units 80, 80', constructed for example as described with reference to FIGS. 7A-8B, are shown aligned so that the interconnect solder balls 67' on package unit 80' are aligned with the ball pads (not shown in this view) on the land side 11 of substrate 12 of package 30 of package unit 80. The units are brought together, as suggested by the broken arrows, until the solder balls 67' contact the pads. This forms a four-package assembly. The assembly is heated to reflow the solder balls 67' and make electrical interconnection between the two units 80, 80'. The balls are shown collapsed following remelt in the four-package assembly 110 in FIGS. 11A and 11B. Then the assembly can be encapsulated, as shown at 125 in FIGS. 12A and 12B to fill in the space between the substrates around the die and the solder balls. This completes a module 120 having two complementary packages. The module has an "upper" surface 121, and the solder balls on the lowermost package, numbered 127 in FIGS. 11A and 11B, serve for electrical interconnection of the module 120 with a device in which it is employed, such as a motherboard, for example, in a mobile computing or communications product. The solder remelt can be performed for all the solder ball interconnections in a single remelt step.

Other embodiments are within the scope of the invention. For example, although the respective die on the complementary packages are illustrated in the FIGs. as having about the same dimensions, the respective die may in other embodiments have different thicknesses or footprints, particularly where the die have different functionalities. And, for example, although the respective substrates in the complementary packages are illustrated in the FIGs. as having the same length and width, the respective substrates may in other embodiments have different footprints. In any event, the unoccupied region of the die mount side of each substrate must be sufficiently large, and must be configured, to accommodate the length and width of the surface of the die or of the molding over the die in the complementary package.

The multipackage modules can be useful in any of a variety of electronic devices, and they can be particularly useful in products where a high device density is desirable, and where there may be limited space within the product to accommodate the dimensions (footprint, thickness) of the device assemblies. Such products include, for example, portable communications devices such as cellular telephones and personal digital assistants, laptop computers, digital cameras, and electronic entertainment products.

What is claimed is:

1. A semiconductor chip package comprising a substrate having a die mount side and a land side, the die mount side including a die attach region asymmetrically arranged on the substrate and an unoccupied region asymmetrically arranged on the substrate, and a die attached in the die attach region of the die mount side of the substrate.

2. The package of claim 1 wherein the die is oriented with an active side of the die facing away from the substrate and affixed to the die attach region with using an adhesive, and is electrically connected by wires between die pads in the active side of the die and bond pads in the substrate.

3. The package of claim 2 wherein a molding encloses the wires and at least the die pads in the active side of the die.

4. The package of claim 1 wherein the die is affixed with an active side of the side facing toward the substrate, and is electrically connected to the die attach region by flip chip interconnection between die pads in the active side of the die and interconnect sites in the substrate.

5. The package of claim 4, further comprising an underfill between the active side of the die and the die attach region of the substrate.

6. The package of claim 1, further comprising z-interconnection solder balls mounted on ball pads on the die mount side of the substrate.

7. The package of claim 1, further comprising z-interconnection solder balls mounted on ball pads on the land side of the substrate.

8. A method for making a semiconductor chip package, comprising:
   providing a package substrate having first and second sides and having a first patterned metal layer at the first side and a second patterned metal layer at the second side, the first side comprising a die attach region asymmetrically arranged on the package substrate and an unoccupied region asymmetrically arranged on the package substrate;
   providing a semiconductor die having die pads on an active side thereof; and
   mounting the die on the die attach region of the first side of the substrate and electrically interconnecting the die to bond pads of the first patterned metal layer.

9. The method of claim 8 wherein mounting the die comprises affixing the die on the die attach region with the active side of the die facing away from the substrate, and wherein electrically connecting the die comprises forming wire bond interconnection of the die pads with the bond pads.

10. The method of claim 8 wherein mounting and electrically interconnecting the die comprises positioning the die on the die attach region with the active side facing toward the substrate, and forming flip chip interconnection of the die pads with the bond pads.

11. The method of claim 8, further comprising encapsulating the die and wire bonds.

12. The method of claim 10, further comprising forming an underfill between the die and the substrate.

13. A method for making a semiconductor chip package:
   providing a first substrate having ball pads on a first surface of the first substrate towards one edge of the first substrate and additional ball pads on a second surface of the first substrate towards the one edge of the first substrate; and
   mounting a first die asymmetrically on the first substrate toward another edge of the first substrate.

14. The method of claim 13 wherein providing the first substrate includes the first substrate having further ball pads on the first surface of the first substrate away from the one edge of the first substrate and further additional ball pads on the second surface of the first substrate away from the one edge of the first substrate.

15. The method of claim 13 further comprising mounting interconnects on the additional ball pads.

16. The method of claim 13 wherein:
   mounting the first die includes mounting the first die with an edge of the first die coplanar with the one edge; and
   providing the first substrate includes providing the first substrate with ball pads on the first surface only towards two edges of the first substrate.

17. The method of claim 13 further comprising:
   providing a second substrate having ball pads on a first surface of the second substrate towards one edge of the second substrate and additional ball pads on a second surface of the second substrate towards the one edge of the second substrate;
   mounting a second die asymmetrically on the second substrate toward another edge of the second substrate; and
   mounting the second substrate over the first substrate with interconnects connecting the ball pads on the first substrate to the ball pads on the second substrate and the first die and the second die side-by-side.

18. A semiconductor chip package:
   a first substrate having ball pads on a first surface of the first substrate towards one edge of the first substrate and additional ball pads on a second surface of the first substrate towards the one edge of the first substrate; and
   a first die asymmetrically mounted on the first substrate toward another edge of the first substrate.

19. The package of claim 18 wherein the first substrate includes the first substrate having further ball pads on the first surface of the first substrate away from the one edge of the first substrate and further additional ball pads on the second surface of the first substrate away from the one edge of the first substrate.

20. The package of claim 18 further comprising interconnects mounted on the additional ball pads.

21. The package of claim 18 wherein:
   the first die includes the first die mounted with an edge of the first die coplanar with the one edge; and
   the first substrate includes the first substrate provided with ball pads on the first surface only towards two edges of the first substrate.

22. The package of claim 18 further comprising:
   a second substrate having ball pads on a first surface of the second substrate towards one edge of the second substrate and additional ball pads on a second surface of the second substrate towards the one edge of the second substrate;
   a second die asymmetrically mounted on the second substrate toward another edge of the second substrate; and
   the second substrate mounted over the first substrate with interconnects connecting the ball pads on the first substrate to the ball pads on the second substrate and the first die and the second die side-by-side.

* * * * *